United States Patent
Takao

(10) Patent No.: US 9,485,409 B2
(45) Date of Patent: Nov. 1, 2016

(54) IMAGE CAPTURING APPARATUS AND CONTROL METHOD THEREFOR

(71) Applicant: CANON KABUSHIKI KAISHA, Tokyo (JP)

(72) Inventor: Yumi Takao, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/790,616

(22) Filed: Jul. 2, 2015

(65) Prior Publication Data

US 2016/0006924 A1    Jan. 7, 2016

(30) Foreign Application Priority Data

Jul. 4, 2014 (JP) ................. 2014-139161

(51) Int. Cl.
*H04N 5/232* (2006.01)
*G02B 7/34* (2006.01)
*G06T 7/00* (2006.01)

(52) U.S. Cl.
CPC ............ *H04N 5/23212* (2013.01); *G02B 7/34* (2013.01); *G06T 7/0085* (2013.01)

(58) Field of Classification Search
CPC ...... H04N 5/23212; G02B 7/28; G02B 7/34; G02B 7/346; G02B 7/36–7/38; G03B 13/36
See application file for complete search history.

(56) References Cited

U.S. PATENT DOCUMENTS

2002/0114015 A1* 8/2002 Fujii ................. H04N 1/21
358/302

FOREIGN PATENT DOCUMENTS

JP    2007-094236 A    4/2007

\* cited by examiner

*Primary Examiner* — Paul Berardesca
(74) *Attorney, Agent, or Firm* — Cowan, Liebowitz & Latman, P.C.

(57) ABSTRACT

An image capturing apparatus comprising: an image sensor configured to perform photoelectric conversion on light that enters via an imaging optical system and output an image signal; a focus detection unit configured to detect an in-focus position based on the image signal output from the image sensor; an edge detection unit configured to detect an edge angle and a number of edge of a subject included in an image based on the image signal output from the image sensor; and a correction unit configured to obtain a correction amount for the in-focus position based on the detected edge angle and the number of edge and correct the in-focus position detected by the focus detection unit based on the obtained correction amount.

10 Claims, 9 Drawing Sheets

F I G. 2
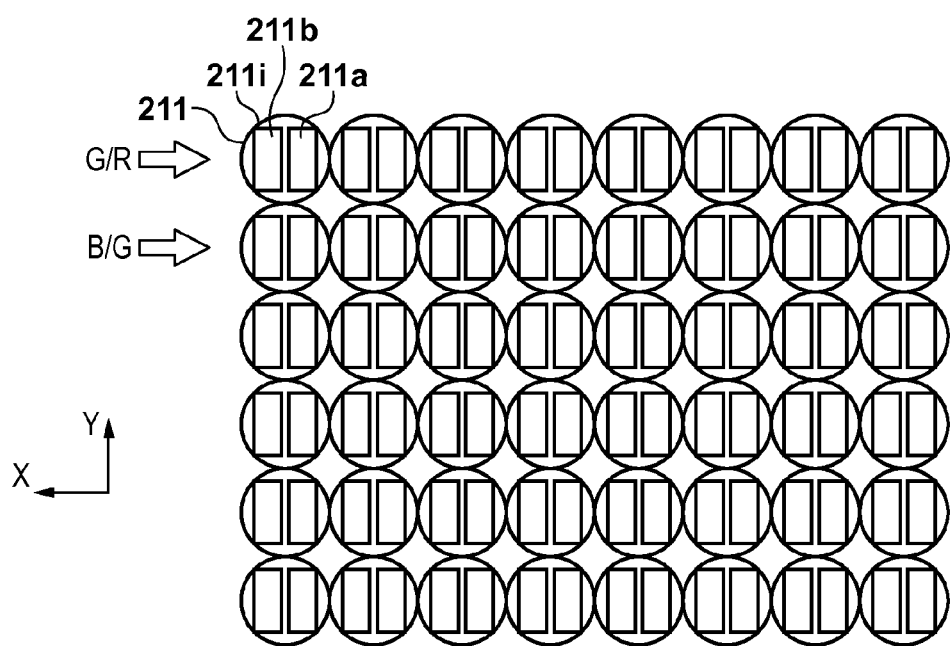

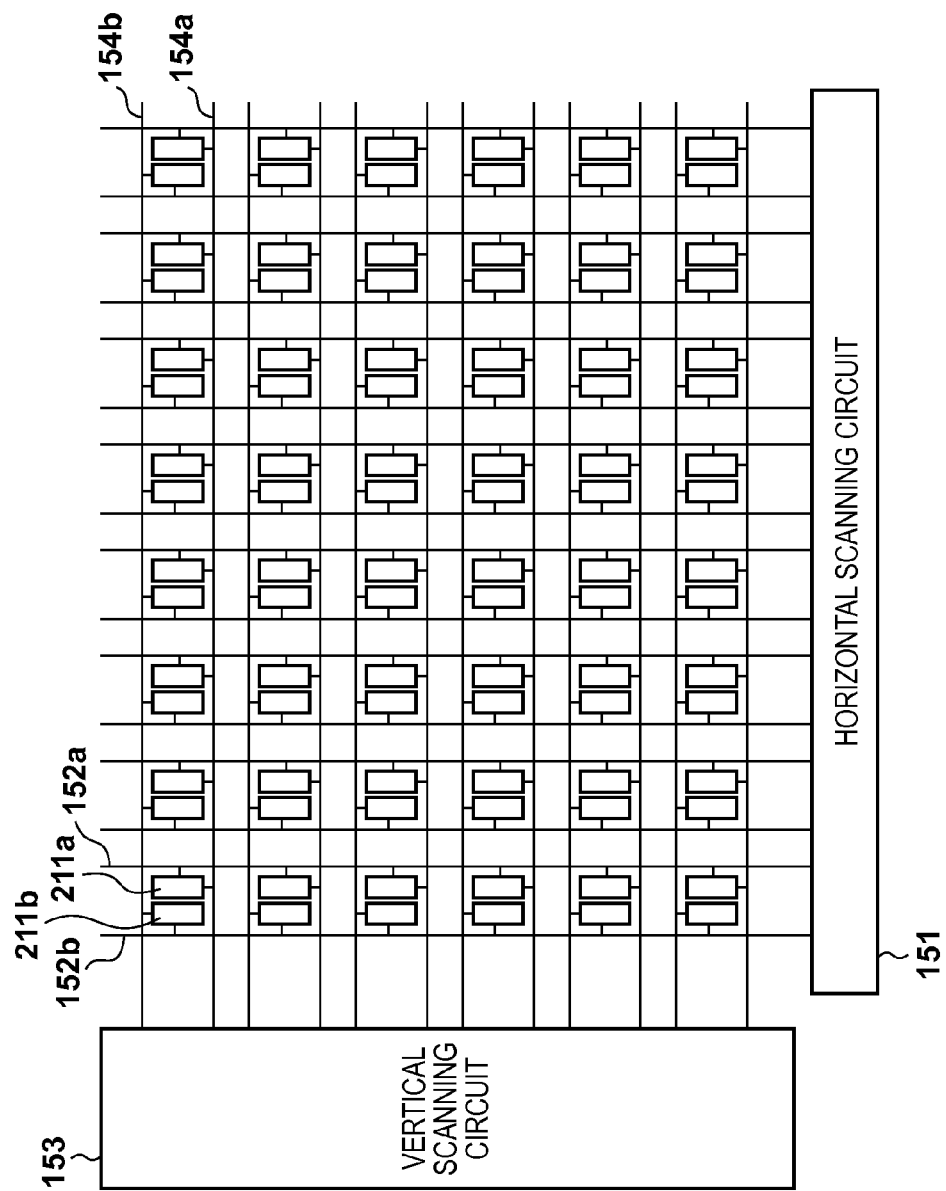

IMAGE CAPTURING APPARATUS AND CONTROL METHOD THEREFOR

BACKGROUND OF THE INVENTION

1. Field of the Invention

The present invention relates to an image capturing apparatus and a control method therefor, and more specifically, to an image capturing apparatus having autofocus function and a control method therefor.

2. Description of the Related Art

Typical schemes of focus control methods for image capturing apparatuses include a contrast AF scheme and a phase difference AF scheme. The contrast AF scheme and the phase difference AF scheme are AF schemes widely used in video cameras and digital still cameras, with an image sensor being used as a focus detection sensor.

In these focus control methods, focus detection results may contain errors due to various aberrations of an optical system. Various methods have been proposed to reduce such errors. Japanese Patent Laid-Open No. 2007-94236 discloses a method in which frequency components are extracted from a signal for focus detection in the two directions that are orthogonal to each other and corrected, and focus detection is performed based on an added output of the corrected frequency components.

Such focus detection error occurs depending on the arrangement direction of pixels on the image sensor that output signals to be used for focus control in the contrast AF method and the phase difference AF method regardless of the focus control methods in a case where an image capturing apparatus using an optical system that has astigmatism, for example.

However, in the configuration disclosed in Japanese Patent Laid-Open No. 2007-94236, there is a problem in which a focus detection error cannot be sufficiently corrected as will be explained below. Firstly, according to Japanese Patent Laid-Open No. 2007-94236, in order to reduce the focus detection error, the focus detection is performed by setting the evaluation directions of the signals for focus control to the horizontal and vertical directions, and weighing the focus detection results detected in the respective evaluation directions. On the other hand, the focus detection error is decided by an angle of an edge of a subject, not by the evaluation direction. For example, if 45° is only an existing edge angle of the subject, a focus detection error is the same for the evaluation in the horizontal direction and for the evaluation in the vertical direction. However, Japanese Patent Laid-Open No. 2007-94236 is silent about a method for correcting the focus detection error in accordance with the edge angle of the subject.

SUMMARY OF THE INVENTION

The present invention has been made in consideration of the above situation, and properly corrects a focus detection error that occurs due to an edge angle of a subject upon performing a focus detection.

According to the present invention, provided is an image capturing apparatus comprising: an image sensor configured to perform photoelectric conversion on light that enters via an imaging optical system and output an image signal; a focus detection unit configured to detect an in-focus position based on the image signal output from the image sensor; an edge detection unit configured to detect an edge angle and a number of edge of a subject included in an image based on the image signal output from the image sensor; and a correction unit configured to obtain a correction amount for the in-focus position based on the detected edge angle and the number of edge and correct the in-focus position detected by the focus detection unit based on the obtained correction amount.

According to the present invention, provided is a control method of an image capturing apparatus comprising: performing photoelectric conversion on light that enters via an imaging optical system and outputting an image signal; detecting an in-focus position based on the output image signal; detecting an edge angle and a number of edge of a subject included in an image based on the output image signal; and obtaining a correction amount for the in-focus position based on the detected edge angle and the number of edge and correcting the in-focus position based on the obtained correction amount.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 2 is a plan view of light receiving pixels as seen from the lens unit side according to the embodiment;

FIG. 3 is a diagram schematically showing the structure of an image sensor including a read circuit according to the embodiment;

DESCRIPTION OF THE EMBODIMENTS

Exemplary embodiments of the present invention will be described in detail in accordance with the accompanying drawings. An embodiment describes an example of applying the present invention to a single-lens reflex digital camera for which a lens is interchangeable.

Description of Structure of Image Capturing Apparatus

Figure 1:
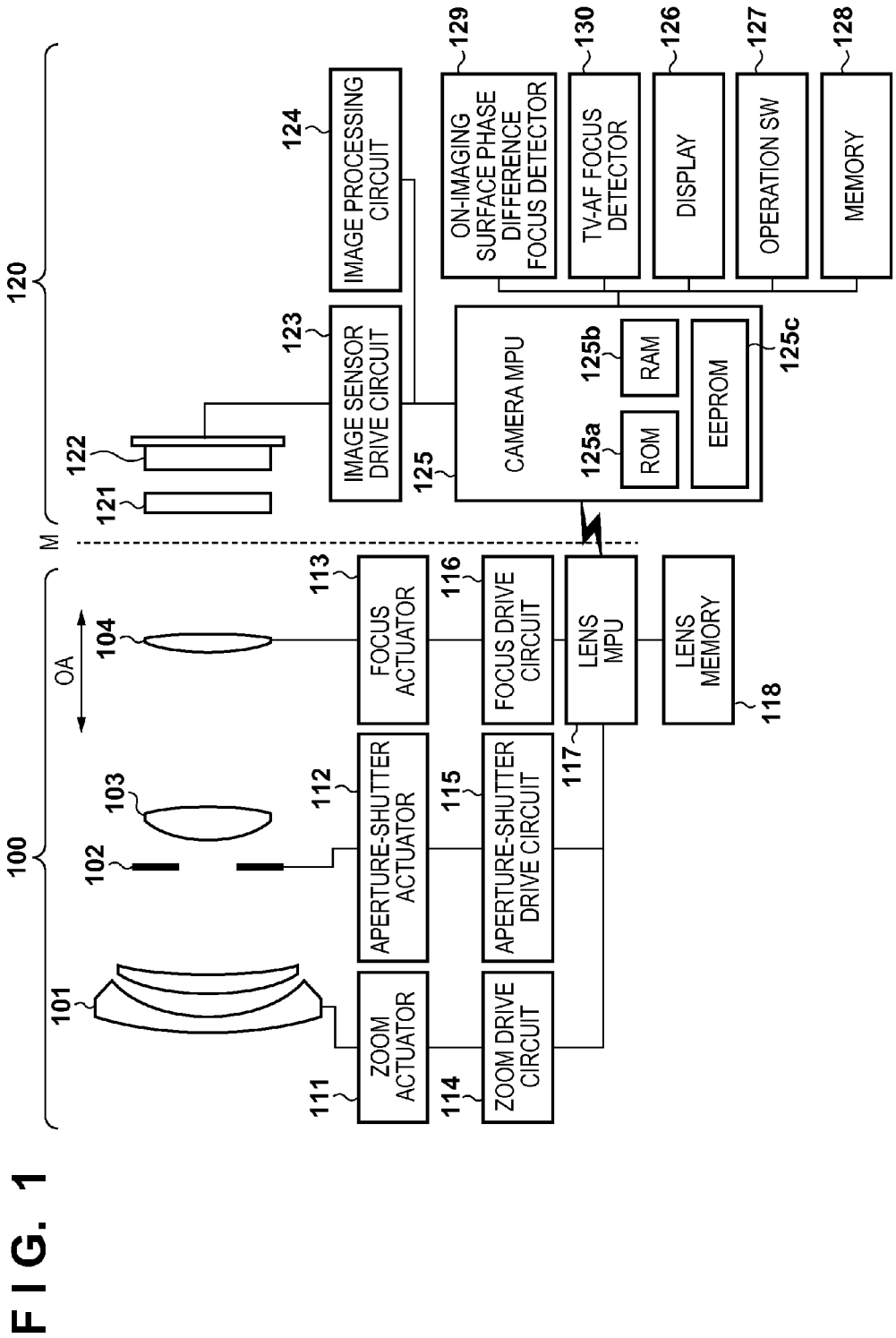
FIG. 1 is a block diagram schematically showing the structure of a digital camera according to an embodiment of the present invention.

FIG. 1 is a block diagram schematically showing the structure of the digital camera according to the embodiment.

As mentioned above, the digital camera in the embodiment is an interchangeable lens type single-lens reflex camera, and includes a lens unit 100 and a camera body 120. The lens unit 100 is connected to the camera body 120 via a mount M indicated by the dotted line in the center of the drawing.

The lens unit 100 includes a first lens group 101, an aperture-shutter 102, a second lens group 103, a focus lens group (hereafter simply referred to as a "focus lens") 104, and a drive/control system. The lens unit 100 thus includes the focus lens 104 and the imaging lens unit for forming an image of a subject.

The first lens group 101 is located at the front end of the lens unit 100, and held to be movable forward and backward in an optical axis direction OA. The aperture-shutter 102 adjusts its aperture diameter to adjust the amount of light when capturing an image, and also functions as a shutter for exposure time adjustment when capturing a still image. The aperture-shutter 102 and the second lens group 103 integrally move forward and backward in the optical axis direction OA, to realize a zoom function together with the forward and backward movement of the first lens group 101. The focus lens 104 is also moved forward and backward in the optical axis direction OA to perform focus control.

The drive/control system includes a zoom actuator 111, an aperture-shutter actuator 112, a focus actuator 113, a zoom drive circuit 114, an aperture-shutter drive circuit 115, a focus drive circuit 116, a lens MPU 117, and a lens memory 118.

The zoom drive circuit 114, according to a zoom operation by a photographer, drives the zoom actuator 111 to drive the first lens group 101 and the second lens group 103 forward and backward in the optical axis direction OA, thus performing the zoom operation. The aperture-shutter drive circuit 115 drives/controls the aperture-shutter actuator 112 to control the aperture diameter of the aperture-shutter 102, thus adjusting the amount of light during image capturing and also controlling the exposure time during still image capturing. The focus drive circuit 116, based on a focus detection result, drives/controls the focus actuator 113 to drive the focus lens 104 forward and backward in the optical axis direction OA, thus performing focus control. The focus actuator 113 has a function of a position detector for detecting the current position of the focus lens 104.

The lens MPU 117 performs all computation and control relating to the lens unit 100, and controls the zoom drive circuit 114, the aperture-shutter drive circuit 115, the focus drive circuit 116, and the lens memory 118. The lens MPU 117 detects the current lens position, and provides lens position information in response to a request from a camera MPU 125. The lens position information includes information about the optical axial position of the focus lens 104, the optical axial position and diameter of an exit pupil in a state where an imaging optical system is not moving, and the optical axial position and diameter of a lens frame that limits the light flux of the exit pupil. The lens memory 118 stores optical information necessary for auto focus control.

The camera body 120 includes an optical low-pass filter (LPF) 121, an image sensor 122, and a drive/control system. The optical LPF 121 and the image sensor 122 function as an image sensing optical system for forming a subject image with a light beam from the lens unit 100. The first lens group 101, the aperture-shutter 102, the second lens group 103, the focus lens 104, and the optical LPF 121 constitute the above-mentioned imaging optical system.

The optical LPF 121 reduces false color and moire in a captured image. The image sensor 122 is composed of a CMOS sensor and its peripheral circuitry, and has m pixels in the horizontal direction and n pixels in the vertical direction. The image sensor 122 includes pixels having photoelectric converters of the structure described later with reference to FIG. 2, and can output a pair of signals for performing the below-mentioned focus detection of the phase difference scheme (phase difference AF). Of the obtained signals, those to be used for phase difference AF are converted to focus detection image data by an image processing circuit 124. In addition, of the obtained signals, those to be used for display, recording, or focus detection of the contrast scheme are also transmitted to the image processing circuit 124 and subjected to predetermined processes depending on purpose.

The drive/control system includes an image sensor drive circuit 123, the image processing circuit 124, the camera MPU 125, a display 126, an operation switch group 127, a memory 128, an on-imaging surface phase difference focus detector 129, and a TV-AF focus detector 130.

The image sensor drive circuit 123 controls the operation of the image sensor 122, and also performs A/D conversion on an obtained image signal and transmits the converted image signal to the camera MPU 125 and the image processing circuit 124. The image processing circuit 124 performs conversion, color interpolation, JPEG compression, etc. on the image signal obtained by the image sensor 122.

The camera MPU (processor) 125 performs all computation and control relating to the camera body 120, and controls the image sensor drive circuit 123, the image processing circuit 124, the display 126, the operation SW group 127, the memory 128, the on-imaging surface phase difference focus detector 129, and the TV-AF focus detector 130. The camera MPU 125 is connected to the lens MPU 117 via a signal line of the mount M, and issues, to the lens MPU 117, a request to obtain the lens position or a request to drive the lens by a predetermined drive amount, or obtain optical information unique to the lens unit 100. The camera MPU 125 includes a ROM 125$a$ storing a program for controlling camera operation, a RAM 125$b$ storing variables, and an EEPROM 125$c$ storing various parameters.

The display 126 includes an LCD or the like, and displays information about the imaging mode of the camera, a preview image before image shooting and a confirmation image after image shooting, an in-focus state indication image upon focus detection, and the like. The operation switch group 127 includes a power switch, a release (imaging trigger) switch, a zoom operation switch, and an imaging mode selection switch. The memory 128 is a removable memory such as flash memory, and records captured images.

The on-imaging surface phase difference focus detector 129 performs the focus detection process of the phase difference scheme (on-imaging surface phase difference AF) using the focus detection image data obtained by the image sensor 122 and the image processing circuit 124. In more detail, the on-imaging surface phase difference focus detector 129 performs on-imaging surface phase difference AF based on the deviation of a pair of images formed in focus detection pixels by a light beam passing through a pair of pupil areas of the imaging optical system. The method of on-imaging surface phase difference AF will be described in detail later.

The TV-AF focus detector 130 calculates various TV-AF evaluation values using contrast components of image information obtained by the image processing circuit 124, and performs the focus detection process of the contrast scheme (TV-AF). In the focus detection process of the contrast scheme, focus evaluation values at a plurality of focus lens positions are calculated while moving the focus lens 104, and a focus lens position corresponding to a peak focus evaluation value is detected.

Thus, in the embodiment, on-imaging surface phase difference AF and TV-AF are both adopted, and can be used selectively or in combination depending on situation. The camera MPU 125 controls the position of the focus lens 104 using the focus detection result of each of on-imaging surface phase difference AF and TV-AF.

Description of Focus Detection

The following describes focus detection in the digital camera using signals of the image sensor 122 in detail. On-imaging surface phase difference AF and TV-AF are employed in the focus detection in the embodiment. Each of the AF schemes is described first.

(Description of on-Imaging Surface Phase Difference AF)

On-imaging surface phase difference AF is described first with reference to FIGS. 2 to 4B. FIG. 2 is a diagram schematically showing a pixel array in the image sensor 122 in the embodiment. FIG. 2 shows a two-dimensional CMOS area sensor in the range of 6 rows arranged in the vertical direction (direction Y) and 8 columns arranged in the horizontal direction (direction X), as seen from the lens unit 100 side. Color filters are put in a Bayer array. In pixels 211 of odd rows, green and red color filters are alternately arranged from left. In pixels 211 of even rows, blue and green color filters are alternately arranged from left. An on-chip microlens 211i is formed on each color filter. A plurality of rectangles inside the on-chip microlens 211i are photoelectric converters 211a and 211b.

In the embodiment, the photoelectric converter of every pixel is split into two areas in the direction X, and a photoelectric conversion signal in one of the split areas and a sum of photoelectric conversion signals in the two areas can be read independently of each other. From the independently read signals, the difference between the sum of photoelectric conversion signals in the two areas and the photoelectric conversion signal in one of the split areas is calculated as a signal corresponding to a signal obtained in the other photoelectric conversion area. Such photoelectric conversion signals in the split areas are used as phase difference detection signals for phase difference AF by the below-mentioned method, and can also be used to generate a stereoscopic (3D) image made up of a plurality of images having parallax information. Meanwhile, the sum of photoelectric conversion signals in the two areas is used as a normal captured image.

FIG. 3 is a diagram schematically showing the structure of the image sensor 122 including a read circuit in the embodiment. Reference numeral 151 indicates a horizontal scanning circuit, and 153 indicates a vertical scanning circuit. Vertical scan lines 152a and 152b and horizontal scan lines 154a and 154b are arranged at the boundaries of the pixels, and signals are read out from the photoelectric converters 211a and 211b via these scan lines.

The image sensor 122 in the embodiment can be driven in the following two types of read modes that differ in resolution. The first read mode is all-pixel read mode which is a mode for capturing a high-resolution still image. The signals of all pixels are read in this case.

The second read mode is decimation read mode which is a mode for recording a moving image or displaying only a preview image. Since the number of pixels necessary in this case is smaller than the number of all pixels, signals are read only from pixels as a result of decimating pixels by a predetermined ratio in both of the directions X and Y. The decimation read mode is equally used in the case where high-speed reading is required. In the case of decimation in the direction X, signals are added to improve the S/N. In the case of decimation in the direction Y, signal outputs from rows to be decimated are ignored. The focus detection in the phase difference scheme and the contrast scheme is typically performed in the second read mode.

Figure 4A:
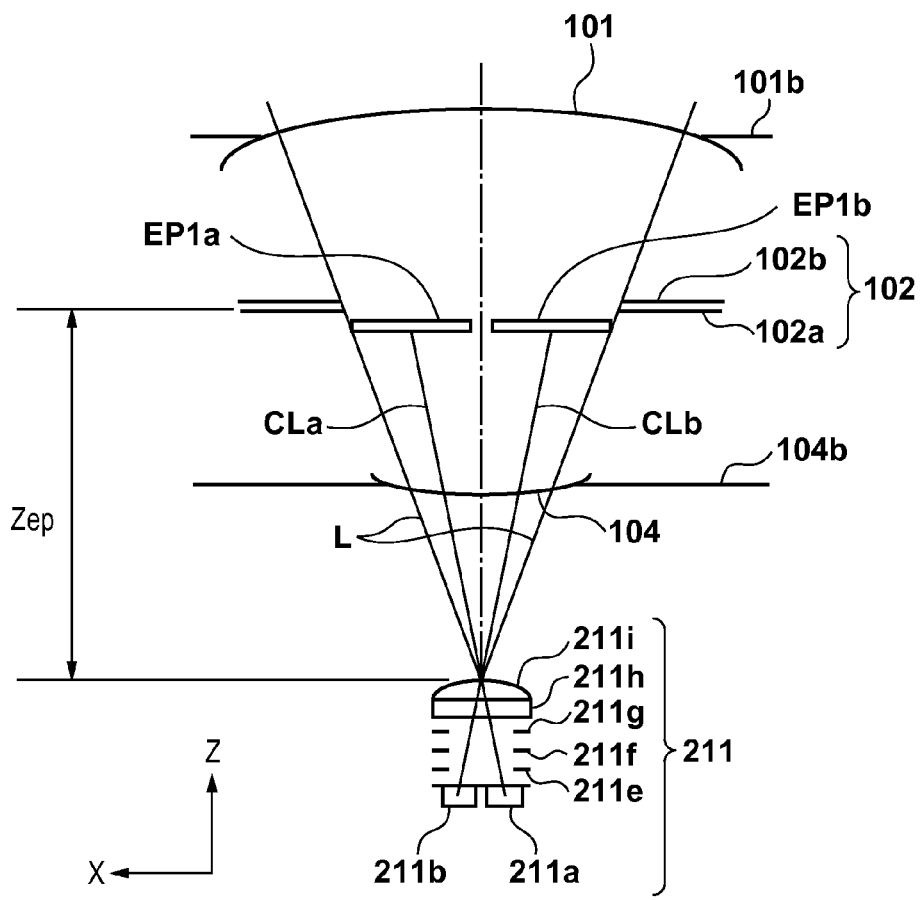
FIGS. 4A and 4B are diagrams for describing the conjugate relation between an exit pupil plane of an imaging optical system and photoelectric converters of a pixel located around the center of an imaging plane according to the embodiment.
Figure 4B:
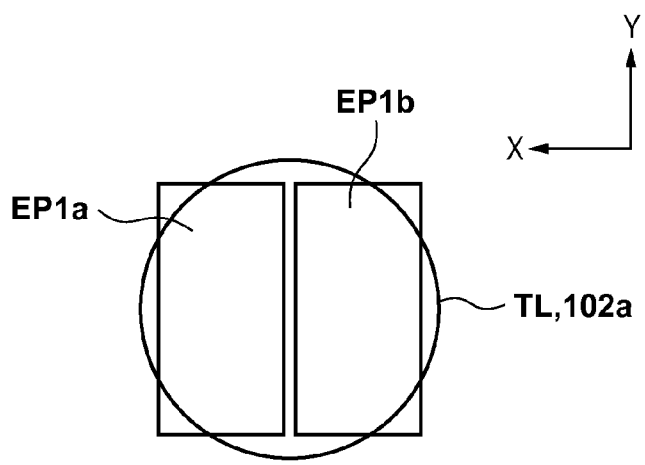

FIGS. 4A and 4B are diagrams for describing the conjugate relation between the exit pupil plane of the imaging optical system and the photoelectric converters of the pixel 211 at an image height of 0, i.e. located around the center of the imaging plane, in the image capturing apparatus in the embodiment. The photoelectric converters 211a and 211b of the pixel 211 in the image sensor 122 and the exit pupil plane of the imaging optical system are designed to be in the conjugate relation by the on-chip microlens 211i. Typically, the exit pupil of the imaging optical system substantially matches a plane on which an iris diaphragm for adjusting the amount of light is placed. The imaging optical system in the embodiment is a zoom lens having zoom function. Depending on the type of the imaging optical system, the distance of the exit pupil from the imaging plane or the size of the exit pupil changes when a zoom operation is performed. In the imaging optical system in FIGS. 4A and 4B, the focal length is intermediate between the wide angle end and the telephoto end, i.e. in the state of "middle". Assuming this as a standard exit pupil distance Zep, eccentric parameters corresponding to the image height (X, Y coordinates) and the shape of the on-chip microlens are designed optimally.

In FIG. 4A, a tube member 101b holds the first lens group 101, and a tube member 104b holds the focus lens 104. The aperture-shutter 102 has an aperture plate 102a for defining the aperture diameter in a full open state, and an aperture blade 102b for adjusting the aperture diameter during closing. The tube member 101b, the aperture plate 102a, the aperture blade 102b, and the tube member 104b which function as the member for limiting the light beam passing through the imaging optical system show an optical virtual image as observed from the imaging plane. Moreover, a synthetic aperture near the aperture-shutter 102 is defined as the exit pupil of the lens, and the distance from the imaging plane is defined as Zep as mentioned above.

Further, as shown in FIG. 4A, the pixel 211 is composed of the following members from the lowest layer: the photoelectric converters 211a and 211b; wiring layers 211e to 211g; a color filter 211h; and the on-chip microlens 211i. The two photoelectric converters 211a and 211b are projected on the exit pupil plane of the imaging optical system by the on-chip microlens 211i. In other words, the exit pupil of the imaging optical system is projected on the surfaces of the photoelectric converters 211a and 211b through the on-chip microlens 211i.

FIG. 4B shows the projected images of the photoelectric converters 211a and 211b on the exit pupil plane of the imaging optical system. The projected images of the photoelectric converters 211a and 211b are EP1a and EP1b, respectively. In the embodiment, the image sensor 122 can obtain the output of one of the two photoelectric converters 211a and 211b and the output of the sum of the two photoelectric converters 211a and 211b, as mentioned earlier. The output of the sum of the two photoelectric converters 211a and 211b corresponds to the result of photoelectrically converting the light beam passing through both of the areas of the projected images EP1a and EP1b which occupy substantially the whole pupil area of the imaging optical system.

In FIG. 4A, the light beam is regulated by the aperture plate 102a of the diaphragm as represented by the outermost part L of the light beam passing through the imaging optical system, and the projected images EP1a and EP1b have substantially no vignetting due to the imaging optical system. In FIG. 4B, the light beam in FIG. 4A is denoted by TL. Most of the projected images EP1a and EP1b of the photoelectric converters 211a and 211b are contained within the light beam TL indicated by the circle, which also demonstrates that substantially no vignetting occurs. Since the light beam is limited only by the aperture plate 102a of the diaphragm, the light beam TL is substantially equal to the aperture diameter of the aperture plate 102a. Here, the respective vignetting states of the projected images EP1a and EP1b are symmetric with respect to the optical axis in the center of the imaging plane, and the photoelectric converters 211a and 211b receive the same amount of light.

Thus, the microlens 211i and the split photoelectric converters 211a and 211b pupil-split the light beam exited from the lens unit 100. The result of concatenating and organizing the outputs of the photoelectric converters 211a in a plurality of pixels 211 of a predetermined range on the same row is denoted as an AF image A, and the result of concatenating and organizing the outputs of the photoelectric converters 211b in the plurality of pixels 211 of the predetermined range on the same row is denoted as an AF image B. As the signal of each of the AF images A and B, a pseudo luminance (Y) signal calculated by adding the outputs of green, red, blue, and green of the photoelectric converters 211a or 211b in the Bayer array is used here. Alternatively, the AF images A and B may be organized for each of the colors of red, blue, and green. By detecting the relative image deviation of such generated AF images A and B by correlation computation, it is possible to detect the focus deviation in the predetermined area, i.e. the defocus amount. In the embodiment, though one of the AF images A and B is not output from the image sensor 122, the sum of the images A and B is output as mentioned above and so the signal of the one of the AF images A and B can be obtained from the difference between the output of the sum and the output of the other one of the AF images A and B.

As described above with reference to FIGS. 2 to 4B, the image sensor 122 includes pixels that receive light beams passed through the exit pupil being split, so that phase difference AF can be performed using the obtained signals.

Although the above describes the structure of splitting the exit pupil in the horizontal direction, pixels for splitting the exit pupil in the vertical direction may also be provided in the image sensor 122. The provision of pixels for splitting the exit pupil in both directions enables focus detection corresponding to the contrast of the subject in not only the horizontal direction but also the vertical direction. Further, although the above describes the case where two photoelectric converters split each of all pixels, the three or more photoelectric converters may split each pixel, and the photoelectric converters may split a part of the pixels if phase difference AF is only concerned.

(Description of TV-AF)

Figure 5:
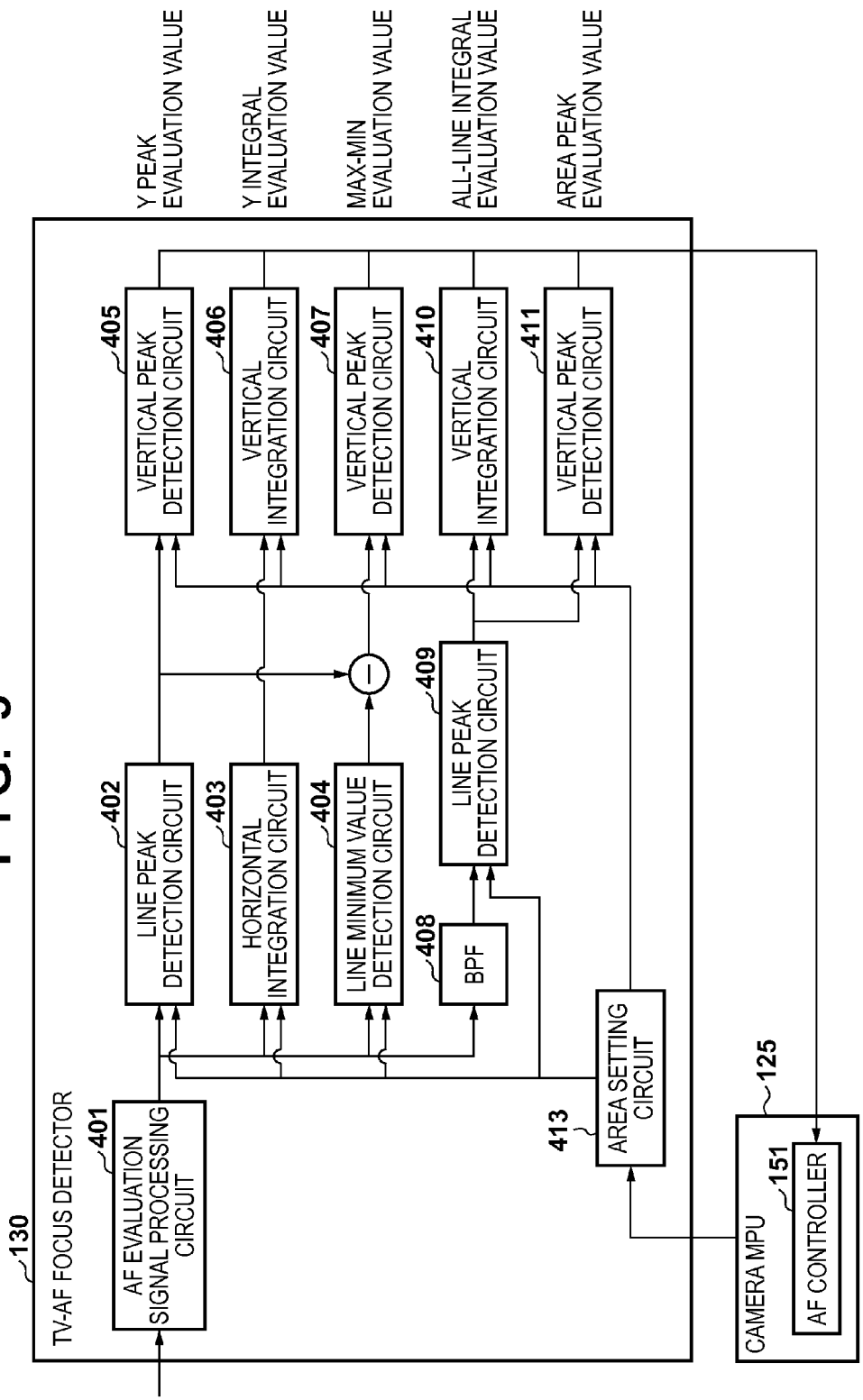
FIG. 5 is a block diagram mainly showing the structure of a TV-AF focus detector according to the embodiment.

The following describes process flow of calculating various AF evaluation values for TV-AF. FIG. 5 is a block diagram mainly showing the structure of the TV-AF focus detector 130.

When a signal read from the image sensor 122 is input to the TV-AF focus detector 130, an AF evaluation signal processing circuit 401 extracts a green (G) signal from a Bayer array signal, and performs a gamma correction process of emphasizing low luminance components and suppressing high luminance components. Although the embodiment describes the case where a green (G) signal is used in TV-AF, all signals of red (R), blue (B), and green (G) may be used. Moreover, a luminance (Y) signal may be generated using all colors of RGB. Hence, the output signal generated by the AF evaluation signal processing circuit 401 is hereafter referred to as the luminance signal Y, regardless of which color is used.

The following describes a method of calculating a Y peak evaluation value. The luminance signal Y gamma-corrected by the AF evaluation signal processing circuit 401 is input to a line peak detection circuit 402 for detecting a line peak value per horizontal line. The line peak detection circuit 402 detects a Y line peak value per horizontal line in each focus detection area set by an area setting circuit 413. The output of the line peak detection circuit 402 is input to a vertical peak detection circuit 405. The vertical peak detection circuit 405 performs peak hold in the vertical direction in each focus detection area set by the area setting circuit 413, to generate a Y peak evaluation value. The Y peak evaluation value is effective for determination of a high luminance subject or a low illuminance subject.

The following describes a method of calculating a Y integral evaluation value. The luminance signal Y gamma-corrected by the AF evaluation signal processing circuit 401 is input to a horizontal integration circuit 403 for detecting an integral value per horizontal line. The horizontal integration circuit 403 calculates the integral value of the luminance signal Y per horizontal line in each focus detection area set by the area setting circuit 413. The output of the horizontal integration circuit 403 is input to a vertical integration circuit 406. The vertical integration circuit 406 performs integration in the vertical direction in each focus detection area set by the area setting circuit 413, to generate a Y integral evaluation value. The Y integral evaluation value enables determination of the brightness of each focus detection area as a whole.

The following describes a method of calculating a max-min evaluation value. The luminance signal Y gamma-corrected by the AF evaluation signal processing circuit 401 is input to the line peak detection circuit 402, to detect the Y line peak value per horizontal line in each focus detection area. The gamma-corrected luminance signal Y is also input to a line minimum value detection circuit 404. The line minimum value detection circuit 404 detects the minimum value of the luminance signal Y per horizontal line in each focus detection area. The detected line peak value and minimum value of the luminance signal Y per horizontal line are input to a subtractor to calculate "(line peak value)−(minimum value)", and then the result is input to a vertical peak detection circuit 407. The vertical peak detection circuit 407 performs peak hold in the vertical direction in each focus detection area, to generate a max-min evaluation value. The max-min evaluation value is effective for determination of low contrast and high contrast.

The following describes a method of calculating an area peak evaluation value. The luminance signal Y gamma-corrected by the AF evaluation signal processing circuit 401 is input to a BPF 408 to extract a specific frequency component and generate a focus signal. The focus signal is input to a line peak detection circuit 409 for detecting a line peak value per horizontal line. The line peak detection circuit 409 detects a line peak value per horizontal line in each focus detection area. The detected line peak value is subjected to peak hold in each focus detection area by a vertical peak detection circuit 411, to generate an area peak evaluation value. The area peak evaluation value changes little even when the subject moves in each focus detection area, and so is effective in determining whether or not to shift from an in-focus state to a state for searching for an in-focus position again.

The following describes a method of calculating an all-line integral evaluation value. The line peak detection circuit 409 detects the line peak value per horizontal line in each focus detection area, as in the case of the area peak evaluation value. The line peak value is input to a vertical integration circuit 410, to perform integration for all the horizontal scan lines in the vertical direction in each focus detection area to generate an all-line integral evaluation value. The high-frequency all-line integral evaluation value has a wide dynamic range and high sensitivity because of the effect of integration, and so is effective as a main evaluation value of TV-AF for detecting an in-focus position. In the embodiment, this all-line integral evaluation value that changes according to the defocus state and is used for focus control is referred to as a focus evaluation value.

The area setting circuit 413 generates a gate signal for each focus detection area for selecting a signal at a predetermined position in the screen set by the camera MPU 125. The gate signal is input to each of the line peak detection circuit 402, the horizontal integration circuit 403, the line minimum value detection circuit 404, the line peak detection circuit 409, the vertical peak detection circuits 405, 407, and 411, and the vertical integration circuits 406 and 410. The timing at which the luminance signal Y is input to each circuit is controlled so that each evaluation value is generated for the luminance signal Y in each focus detection area. The area setting circuit 413 can set a plurality of areas in accordance with each focus detection area.

An AF controller 151 in the camera MPU 125 receives each evaluation value obtained in the above-mentioned manner, and controls the focus actuator 113 via the focus drive circuit 116 to move the focus lens 104 in the optical axis direction OA, thus executing AF control.

In the embodiment, each type of AF evaluation value is calculated not only in the horizontal line direction but also in the vertical line direction, as described above. This enables focus detection using contrast information of the subject in both the horizontal and vertical directions.

In TV-AF, each type of AF evaluation value mentioned above is calculated while driving the focus lens 104, and the focus lens position corresponding to the maximum all-line integral evaluation value is detected to perform focus detection.

Description of Focus Detection Area

Figure 6:
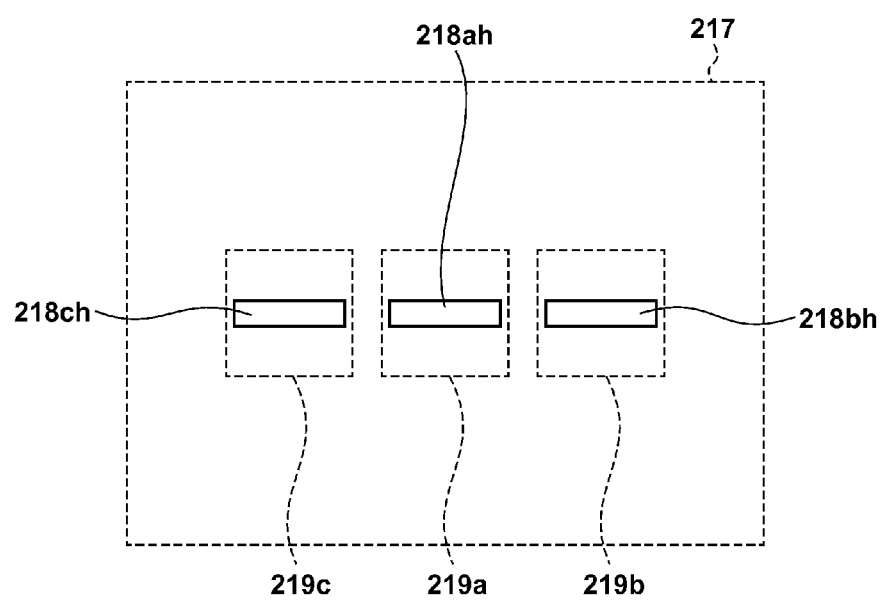
FIG. 6 is a diagram showing an example of focus detection areas according to the embodiment.

FIG. 6 is a diagram showing focus detection areas in an imaging range. On-imaging surface phase difference AF and TV-AF are performed in such a focus detection area based on a signal obtained from the image sensor 122. In FIG. 6, the dotted rectangle represents an imaging range 217 of the image sensor 122. In the embodiment, the focus detection areas 218ah, 218bh, and 218ch for on-imaging surface phase difference AF in the horizontal direction are set at a total of three locations, i.e. a center part and right and left parts of the imaging range 217. In addition, focus detection areas 219a, 219b, and 219c subjected to TV-AF are formed so as to respectively contain the three focus detection areas 218ah, 218bh, and 218ch for on-imaging surface phase difference AF. In each focus detection area subjected to TV-AF, contrast detection is performed using the focus evaluation values in the horizontal and vertical directions as described with reference to FIG. 5.

Although FIG. 6 shows an example where three focus detection areas are roughly provided, the present invention is not limited to three areas, and a plurality of areas may be provided at any positions. In the case where the photoelectric converters split a pixel in the direction Y, an area in which pixels are arranged in the vertical direction may be set as the focus detection area for on-imaging surface phase difference AF.

Description of Focus Detection Process Flow

Figures 7A, 7B:
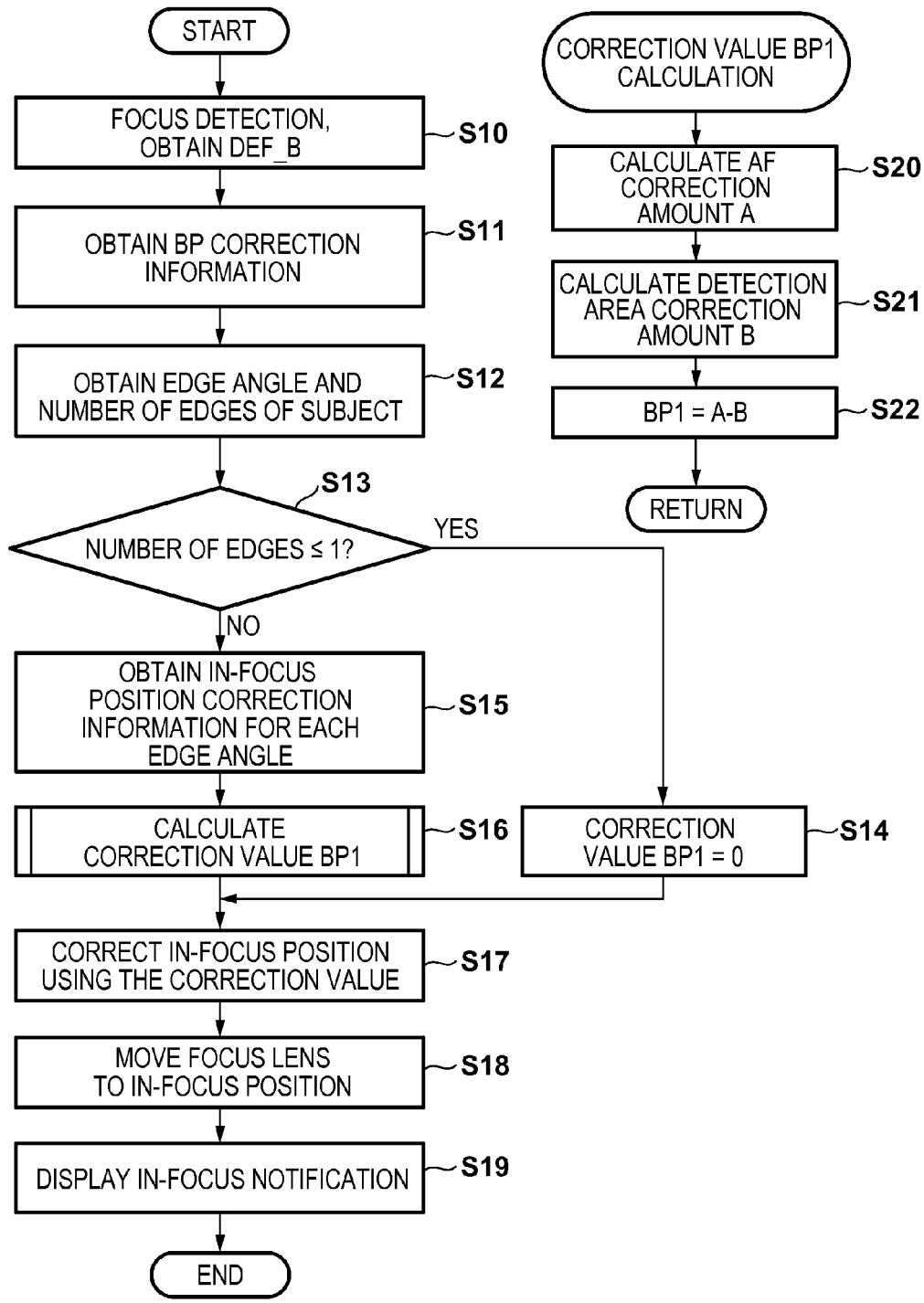
FIGS. 7A and 7B are flowcharts showing an AF processing procedure according to the embodiment.

Next, focus detection (AF) process of the digital camera having the above configuration according to the embodiment will be described with reference to FIGS. 7A and 7B. FIGS. 7A and 7B are flowcharts showing an AF processing procedure of the digital camera. The control program relating to this processing is executed by the camera MPU 125. When the AF processing starts, the camera MPU 125 sets focus detection areas as shown in FIG. 6 for performing focus control on a subject in step S10, and performs focus detection either in the phase difference scheme or in the contrast scheme. The focus detection result obtained here is denoted by DEF_B.

Figure 8:
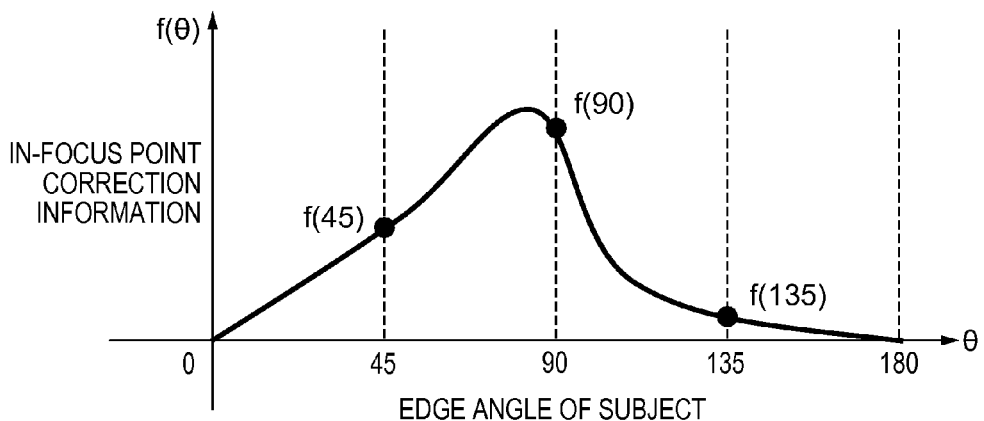
FIG. 8 is a diagram showing an example of BP correction information according to the embodiment.
Figure 9:
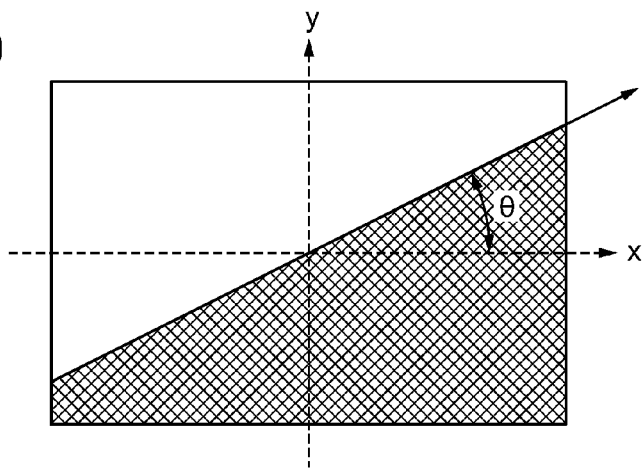
FIG. 9 is a diagram illustrating an edge angle of a subject according to the embodiment.

Next in step S11, BP (best focus point) correction information is obtained. BP correction information is information for correcting an error of a focus position that occurs in accordance with each edge angle. As this information differ between different lenses, it is obtained via the lens MPU 117 in response to a request of the camera MPU 125. Alternatively, the camera 120 may store the BP correction information in relation to the lens unit 100. FIG. 8 shows an example of the BP correction information stored in the lens memory 118. The lens memory 118 stores in-focus point correction information $f(\theta)$ corresponding to the edge angle $\theta$ of a subject that can be obtained as described below. The edge angle of the subject here is an angle of a slope of an edge of the subject with respect to the reference coordinate XY on a screen as shown in FIG. 9. The edge angle of a subject in a case where the subject is as shown by the hatching in FIG. 9 is $\theta$, and the in-focus position correction information in that case is $f(\theta)$.

In a case where theoretical BP correction information of a designed structure is stored, in-focus position correction information between $\theta=0°$ to $45°$ shown in FIG. 9 needs to be stored as the information, since the in-focus position correction information $f(\theta)$ are the same for focus detection areas located at symmetric positions with respect to an optical axis of an optical imaging system. Further, in a case where the correction value varies a little depending on the edge angle of a subject, the BP correction information may be stored as a common value.

In a case where the in-focus position correction information for the focus detection result subjected to correction changes in accordance with the zoom position and the focus lens position, it is desirable to store the correction information as shown in FIG. 8 for each state of the zoom position and the focus lens position. Further, since the in-focus position correction information differ for different image heights, it is desirable to store the correction information for predetermined image heights.

Next, the edge angle/angles and the number of edge/edges of a subject are obtained in step S12. Here, the angle of the slope of an edge with respect to the coordinates XY in a screen is detected for each focus detection area. In an example shown in FIG. 6, if DEF_B is obtained by the on-imaging surface phase difference AF, the edge angle/angles and the number of the edge/edges are obtained for each of the focus detection areas 218ah, 218bh and 218ch. If DEF_B is obtained by the TV-AF, the edge angle/angles and the number of edge/edges are obtained for each of the focus detection areas 219a, 219b and 219c. Here, the edge detection is performed by applying edge filtering process or the like, and detects edge angle/angles. An example of edge detection process will be explained with reference to FIG. 10, although the edge detection method is not limited thereto.

The direction of slope q(x, y) at each pixel position coordinates (x, y) is calculated using the following expression (1), for example.

$$\theta(x,y)=\tan^{-1}(V(x,y)/H(x,y)) \quad (1)$$

Figure 10:
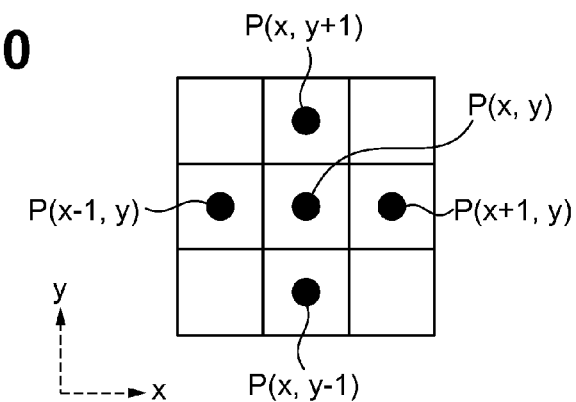
FIG. 10 is a diagram for explaining a method for calculating the direction of a slope at the coordinates of each pixel position according to the embodiment.

The pixel position coordinates (x, y) are expressed in the rectangular coordinate system with the light direction and the up direction being positive as shown in FIG. 9. Here, H(x, y) indicates a horizontal contrast intensity of a specific frequency at the coordinates (x, y), and given by the following expression (2). Here, P($\alpha$, $\beta$) indicates a luminance value at a pixel position ($\alpha$, $\beta$). FIG. 10 shows a corresponding diagram of respective coordinates when enlarged to a pixel level.

$$H(x,y)=P(x+1,y)-P(x-1,y) \quad (2)$$

Similarly, V(x, y) indicates a vertical contrast intensity of a specific frequency at the coordinates (x, y), and given by the following expression (3)

$$V(x,y)=P(x,y+1)-P(x,y-1) \quad (3)$$

Here, a detection filter used for calculating the contrast intensities of H(x, y) and V(x, y) is (1, 0, −1); however, the detection filter is not limited to this, and a filter capable of detecting the frequency components of a subject may be used instead.

Next, the edge angle/angles $\theta$ and the number of edge/edges n of a subject in each focus detection area are obtained from the slope direction $\theta(x, y)$ at each pixel position coordinates (x, y). Here, the slope direction $\theta(x, y)$ is obtained for each pixel position coordinates of each focus detection area, a histogram is generated for each focus detection area, and the edge angle/angles $\theta$ and the number of edges/edges n of the subject is obtained for each focus detection area. The method of this will be explained with reference to FIG. 11.

Figure 11:
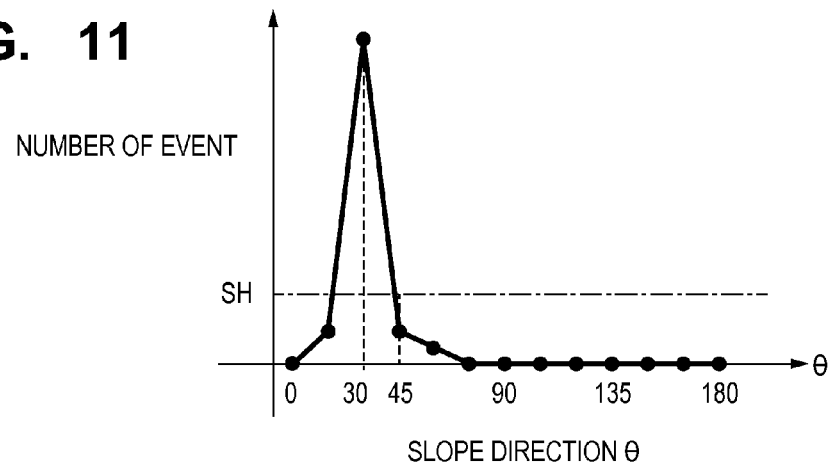
FIG. 11 is a diagram for explaining a method for obtaining an edge angle of a focus detection area.

FIG. 11 is a histogram in which an ordinate shows a slope direction $\theta$ and an abscissa shows the number of event, when the slope direction $\theta(x, y)$ is calculated at each pixel position coordinates (x, y) in a focus detection area. If the subject as shown in FIG. 9 is shot in the focus detection area, the histogram showing the frequency of occurrence is as shown in FIG. 11, and exhibits that the subject shown in FIG. 9 has an edge having an intensity in the slope direction $\theta=30°$. At this time, it is expected that a certain number of detection errors occur due to an electrical signal noise of the image sensor 122, blurriness of a subject image, and parallax of lenses. Accordingly, the slope direction having the frequency of occurrence not less than a detection number threshold SH is determined as the edge angle $\theta$ of the subject in the focus detection area. Namely, in the example of FIG. 11, $\theta=30°$ and n=1, since only the slope direction $\theta$ having the number of occurrence not less than the detection number threshold SH is determined as the edge angle $\theta$.

In step S13, it is determined whether or not the number of edge/edges n of the subject detected in step S12 is 1 or less (namely, 1 or 0). If the number of edge/edges n is 1 or less, the process proceeds to step S14, where the correction value BP1=0 is set. This is because if only one edge angle $\theta$ exists, the focus position is determined based on the edge regardless of the detection direction of focus detection system, and the BP correction in accordance with the edge angel is not needed. Further, when no edge is detected, the BP detection in accordance with the edge angle cannot be performed, there is no need to perform BP correction.

Figure 12A:
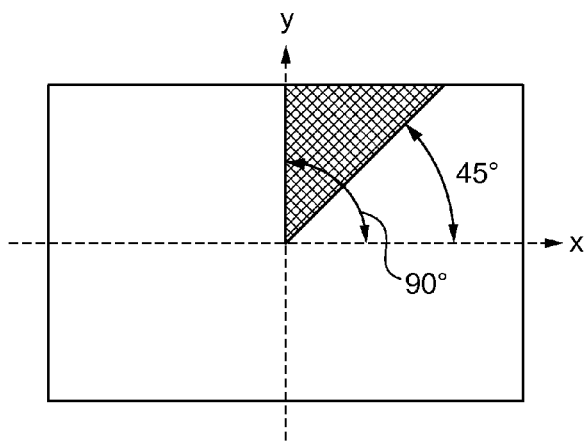
FIGS. 12A and 12B show examples of edges and contrasts of a subject according to the embodiment.
Figure 12B:
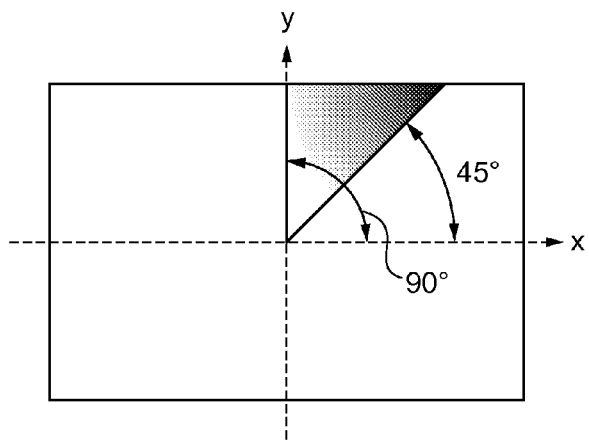

On the other hand, in a case where it is determined that the number of edge/edges n of the subject is plural in step S13, the process proceeds to step S15. In step S15, in-focus position correction information f($\theta$) for each of the plurality of edge angles $\theta$ is obtained from the BP correction information obtained in step S11. If two edges exist in the subject as shown in FIGS. 12A and 12B and the edge angles $\theta$ are 45° and 90°, the number of edges n of the subject=2, and the in-focus position correction information to be obtained from in the BP correction information shown in FIG. 8 is f(45) and f(90).

Next in step S16, the correction value BP1 is calculated by weighing the in-focus position correction information corresponding to the edge angles $\theta$ of the subject obtained by the process of step S15.

Here, a calculation method of the correction value BP1 will be explained with reference to FIG. 7B. In step S20, an AF correction amount A is calculated. in this step, among the plurality of edge angles $\theta$ of the subject detected in step S12, an edge angle $\theta$X used in AF detection is selected, and the AF correction amount A=f($\theta$X) is detected from a BP correction information table.

The edge angle $\theta$X may be stored for each line of AF detection. Alternatively, the edge angle $\theta$X may be an edge angle that may be used in AF at high possibility. For example, in a case where a subject is as shown in FIG. 12A and the scan direction for AF detection is the ascending direction of the x-axis, there is a high possibility that focus detection is performed on the basis of an edge having an angle (an angle closest to $\theta=90°$ in FIG. 12A) orthogonal to the ascending direction of the x-axis. In this case, $\theta$X=90° may be used. Alternatively, an edge angle $\theta$ of the subject at a position where the contrast of the edge is high may be selected as $\theta$X. For example, if a subject shown in FIG. 12B exists in a focus detection area, the edge angles of the subject detected in step S12 are $\theta=45°$ and 90°. Between them, in the subject shown in FIG. 12B, the contrast of the subject is higher at $\theta=45°$, $\theta$X=45° may be selected. Further, $\theta$X may be determined in accordance with the scanning direction at the time of AF detection and edge contrast, or may be calculated by weighting in accordance with contrast. For the contrast direction of the subject, the Max-Min evaluation value as described above may be suitably used. As described above, an edge angle with higher probability that may have been used in the AF detection is detected on the basis of the predetermined condition.

Next in step S21, a detection area correction amount B is calculated. In step S21, an average of in-focus position correction amounts f($\theta$i) at each edge angle $\theta$i that exists in an image is calculated on the basis of a plurality of edge angles $\theta$ of a subject detected in step S12 and the BP correction information, and a detection area correction amount B is detected. Given that the number of edges n detected in step S12 is k, then it is obtained with the following equation.

$$B=\Sigma k\, f(\theta i)/k \quad (4)$$

This is based on a thought in which, if two edge angles of a subject exist ($\theta=45°$ and 90°) as shown in FIGS. 12A and 12B, the in-focus position of the subject that a human senses may be given by the average of f(45) and f(90). At this time, if the contrast of the subject differs for different edge angles as shown in FIG. 12B, the sensitivity for focus detection may be higher at an edge having a higher contrast in the captured image. Accordingly, the in-focus position correction amounts f(θi) may be weighted to obtain a weighted average as in step S20. Further, if there is a main subject such as a face in the captured image, a higher weight may be put on the main subject.

In step S22, a difference between the detection area correction amount B detected in step S21 and the AF correction amount A detected in step S20 is calculated to obtain the correction value BP1.

$$BP1 = A - B \quad (5)$$

After calculating the correction value BP1, the process returns to FIG. 7A. In step S17, the focus detection result DEF_B obtained in step S10 is corrected using the calculated correction value BP1 in accordance with the following expression (6), thereby a defocus amount DEF_A is calculated.

$$DEF\_A = DEF\_B - BP1 \quad (6)$$

Here, a method of detecting the edge angle/angles of a subject and correcting the in-focus position for each of the focus detection areas shown in FIG. 6 is described, however, the correction may be performed for each AF detection line. In addition, a correction amount may be calculated from image signals corresponding to part of the focus detection area in order to reduce a calculation load.

Next, in step S18, the focus lens 104 is moved on the basis of the corrected defocus amount DEF_A that is calculated using the expression (6) (focus control). The process proceeds to step S19 where in-focus notification is displayed on the display 126 for the focus detection area where the defocus amount used for driving the focus lens 104 is calculated, and the AF processing is ended.

According to the embodiment as described above, a corrected position for AF is calculated by focusing on an edge angle/angles of a subject when performing focus detection. As a result, the correction value can be calculated in the same method regardless of an AF scheme.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-139161, filed on Jul. 4, 2014, which is hereby incorporated by reference herein in its entirety.

What is claimed is:

1. An image capturing apparatus comprising:
an image sensor configured to perform photoelectric conversion on light that enters via an imaging optical system and output an image signal;
a focus detection unit configured to detect an in-focus position based on the image signal output from the image sensor;
an edge detection unit configured to detect an edge angle and a number of edges of a subject included in an image based on the image signal output from the image sensor; and
a correction unit configured to obtain a correction amount for the in-focus position based on the detected edge angle and the number of edges and correct the in-focus position detected by the focus detection unit based on the obtained correction amount.

2. The image capturing apparatus according to claim 1 further comprising a storage unit configured to store correction information indicative of a plurality of edge angles, and correction amounts for an in-focus position corresponding to the plurality of edge angles, respectively,
wherein the correction unit obtains the correction amount for the in-focus position based on a correction amount, stored in the storage unit, corresponding to the detected edge angle.

3. The image capturing apparatus according to claim 2, further comprising a unit configured to obtain the correction information from the imaging optical system.

4. The image capturing apparatus according to claim 1, wherein in a case where the detected number of edges is plural, the correction unit averages or weighted-averages the correction amounts for the in-focus position corresponding to the plurality of detected edge angles, and performs the correction based on the averaged correction amount.

5. The image capturing apparatus according to claim 4, wherein the correction unit selects an edge angle used for detecting the in-focus position in the focus detection unit on the basis of a predetermined condition and obtains a correction amount corresponding to the selected edge angle, and performs the correction using a difference between the obtained correction amount and the averaged correction amount.

6. The image capturing apparatus according to claim 1, wherein the correction unit avoids performing the correction in a case where the number of detected edge is not plural.

7. The image capturing apparatus according to claim 1, wherein the focus detection unit detects the in-focus position using part of the image signal included in a preset focus detection area, and the edge detection unit detects the edge angle and the number of edges based on the image signal included in the focus detection area.

8. The image capturing apparatus according to claim 1, wherein the focus detection unit detects the in-focus position based on contrast of the image signal.

9. The image capturing apparatus according to claim 1, wherein the image sensor includes a plurality of microlenses, and each of at least part of the microlenses is configured to correspond to a plurality of photoelectric conversion portions, and
wherein the focus detection unit detects the in-focus position based on a phase difference between a pair of image signals corresponding to the plurality of photoelectric conversion portions.

10. A control method of an image capturing apparatus comprising:
performing photoelectric conversion on light that enters via an imaging optical system and outputting an image signal;
detecting an in-focus position based on the output image signal;
detecting an edge angle and a number of edges of a subject included in an image based on the output image signal; and
obtaining a correction amount for the in-focus position based on the detected edge angle and the number of edges and correcting the in-focus position based on the obtained correction amount.

* * * * *